United States Patent
Chen et al.

(10) Patent No.: US 10,597,286 B2
(45) Date of Patent: Mar. 24, 2020

(54) MONOLITHIC PHASE CHANGE HEAT SINK

(71) Applicant: Analog Devices Global, Hamilton (BM)

(72) Inventors: Baoxing Chen, Westford, MA (US); William Allan Lane, Waterfall (IE); Marc T. Dunham, Foster City, CA (US)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/666,475

(22) Filed: Aug. 1, 2017

(65) Prior Publication Data
US 2019/0039883 A1 Feb. 7, 2019

(51) Int. Cl.
| | |
|---|---|
| *B81B 7/00* | (2006.01) |
| *H01L 23/427* | (2006.01) |
| *H01L 23/367* | (2006.01) |
| *H01L 23/373* | (2006.01) |

(52) U.S. Cl.
CPC ........ *B81B 7/0093* (2013.01); *H01L 23/3677* (2013.01); *H01L 23/427* (2013.01); *B81B 2207/096* (2013.01); *H01L 23/373* (2013.01); *H01L 23/3736* (2013.01)

(58) Field of Classification Search
CPC ..... H01L 23/433; H01L 23/427; H01L 23/44; H01L 23/3675; H01L 23/4735; B81B 7/0093
See application file for complete search history.

(56) References Cited

U.S. PATENT DOCUMENTS

| | | | | |
|---|---|---|---|---|
| 5,285,351 | A | * 2/1994 | Ikeda | H01L 23/433 165/104.33 |
| 5,880,524 | A | * 3/1999 | Xie | H01L 23/427 257/704 |
| 7,078,803 | B2 | * 7/2006 | Tilton | F28D 5/00 165/80.4 |
| 8,716,689 | B2 | 5/2014 | Chen et al. | |
| 9,163,883 | B2 | 10/2015 | Yang et al. | |
| 2002/0075652 | A1 | * 6/2002 | Berchowitz | F28D 15/0266 361/700 |

(Continued)

FOREIGN PATENT DOCUMENTS

| | | |
|---|---|---|
| JP | 2002-168547 A | 6/2002 |
| JP | 2008-153423 A | 7/2008 |

(Continued)

*Primary Examiner* — Matthew L Reames
*Assistant Examiner* — John A Bodnar
(74) *Attorney, Agent, or Firm* — Wolf, Greenfield & Sacks, P.C.

(57) ABSTRACT

A monolithic vapor chamber heat dissipating device uses a phase change liquid and one or more wicks to dissipate heat from a heat-generating system. The phase change liquid and one or more wicks may be directly coupled to the heat-generating system, or may be coupled to an intermediate evaporator substrate. The phase change liquid vaporizes as it absorbs heat from the heat-generating system. When the vapor rises and encounters a condenser substrate, the vapor condenses and transfers the heat to the condenser substrate. The condensed vapor is drawn by gravity and the one or more wicks to the phase change liquid coupled to the heat-generating system.

20 Claims, 4 Drawing Sheets

(56) References Cited

U.S. PATENT DOCUMENTS

| | | |
|---|---|---|
| 2002/0131237 A1 | 9/2002 | Snyder et al. |
| 2004/0022028 A1 | 2/2004 | Hildrebrandt |
| 2004/0061218 A1 | 4/2004 | Tilton et al. |
| 2005/0168947 A1* | 8/2005 | Mok ............ H01L 23/427 361/698 |
| 2005/0280162 A1* | 12/2005 | Mok ............ H01L 23/427 257/778 |
| 2006/0090885 A1* | 5/2006 | Montgomery ...... F28D 15/02 165/104.33 |
| 2007/0095507 A1* | 5/2007 | Henderson ....... F28D 15/043 165/104.26 |
| 2008/0225489 A1 | 9/2008 | Cai et al. |
| 2008/0277779 A1* | 11/2008 | Gupta ............ H01L 23/473 257/714 |
| 2009/0020271 A1 | 1/2009 | Yang et al. |
| 2010/0309940 A1 | 12/2010 | Lee |
| 2011/0000649 A1 | 1/2011 | Joshi et al. |
| 2013/0099368 A1* | 4/2013 | Han ............ H01L 23/13 257/692 |
| 2013/0327504 A1 | 12/2013 | Bozorgi et al. |
| 2014/0196498 A1 | 7/2014 | Xiao et al. |
| 2014/0247556 A1* | 9/2014 | Eid ............ H01L 23/3675 361/700 |
| 2015/0348868 A1* | 12/2015 | Lin ............ H01L 21/4803 257/714 |
| 2016/0124474 A1 | 5/2016 | So et al. |
| 2016/0216042 A1 | 7/2016 | Bozorgi et al. |
| 2017/0092561 A1 | 3/2017 | Eid et al. |
| 2017/0160017 A1 | 6/2017 | MacDonald |
| 2017/0205150 A1 | 7/2017 | Safford Smith et al. |

FOREIGN PATENT DOCUMENTS

| | | |
|---|---|---|
| JP | 57-66653 B2 | 8/2015 |
| JP | 2016-054248 A | 4/2016 |
| JP | 2016-092173 A | 5/2016 |
| WO | WO 17/089960 A1 | 6/2017 |
| WO | WO 17/100568 A2 | 6/2017 |

* cited by examiner

MONOLITHIC PHASE CHANGE HEAT SINK

FIELD

Disclosed embodiments are related to heat dissipating devices for semiconductor devices.

BACKGROUND

Heat dissipating devices, such as heat spreaders and heat sinks, are used to dissipate heat from electronic devices. Typical heat sinks have cooling fans that use convection to draw heated air away from the device. Alternatively, heat spreaders are physically coupled to electronic devices such that heat passes from the electronic device to the heat spreader, allowing the heat to dissipate away from the device. Heat spreaders are typically made of materials with high thermal conductivity to maximize the rate of heat transfer from the device to the heat spreader.

SUMMARY

In one embodiment, a monolithic microelectromechanical (MEMS) device is provided including a vapor chamber that comprises a condenser substrate and a device substrate having a device surface and a rear surface. The vapor chamber is enclosed between one of the surfaces of the device substrate and the condenser substrate, wherein the condenser substrate has substantially the same footprint as the device substrate, and one or more wicks extend into the vapor chamber.

According to some embodiments, a monolithic microelectromechanical (MEMS) device including a vapor chamber is provided, the device comprising a condenser substrate, a device substrate having a device surface and a rear surface, wherein the vapor chamber is enclosed between the condenser substrate and one of the device surface or rear surface of the device substrate, and wherein the condenser substrate has approximately a same footprint as the device substrate. The device further comprises one or more wicks extending into the vapor chamber.

According to some embodiments, a micro-scale heat dissipation device is provided, comprising a device substrate comprising an electrical device, the device substrate having a first surface area, a condenser substrate having a second surface area approximately equal the first surface area, wherein the device substrate and condenser substrate are coupled together to define a vapor chamber between them, a phase change liquid in the vapor chamber, and a wick disposed at least partially in the phase change liquid.

According to some embodiments, a micro-scale heat dissipation device is provided, comprising a device substrate having a device surface, a rear surface, and an integrated circuit formed on the device surface, a cap coupled to the device substrate, the cap and the device substrate having a vapor chamber formed between them, a phase change liquid in the vapor chamber, a wick disposed at least partially in the phase change liquid, an external condenser, and a vapor outlet line coupled between the vapor chamber and the external condenser.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

As electronic devices shrink in size, the thermal density of waste heat increases and can degrade device performance or permanently damage device components. To maintain electronic devices, including microelectromechanical systems (MEMS) devices, and associated circuitry at optimal operating temperatures, heat management systems such as heat sinks and heat spreaders can be used to dissipate the heat. However, the inventors have recognized there are problems associated with these heat management systems. For example, heat sinks use active cooling systems, such as fans, which may increase power consumption and contribute additional heat to the circuit. Heat spreaders, which comprise thermally conductive substrates that couple to the electronic device and passively transfer the heat, typically have larger footprints than the device itself to spread out the heat, which impedes device miniaturization. Furthermore, typical electronic devices are localized on portions of heat spreaders, leading to non-uniform heat dissipation and hot spots.

In view of the above, aspects of the present application provide various heat dissipating devices having beneficial configurations. In one embodiment, the heat dissipating device is monolithically integrated with the electronic device, such as a MEMS device or application specific integrated circuit (ASIC). In some such embodiments, the passive and active components of the heat dissipating device and electrical device are formed in a single chip. A monolithic heat dissipating device has the advantage of, in some embodiments, eliminating extraneous thermal interfaces, which improves the heat transfer efficiency. Additionally, a monolithic heat dissipating device and a substrate containing one or more electrical devices may share the same footprint by having substantially the same length and width, thus reducing or minimizing the total space used in the circuit. Since the footprint is limited to the substrate with the one or more electrical devices, heat is drawn more evenly, which reduces hot spots.

Aspects of the present application further provide a heat dissipating device in the form of a vapor chamber. As a passive component, a vapor chamber can dissipate heat without contributing additional heat to the circuit. In one embodiment, the vapor chamber includes a condenser surface bonded to a bottom substrate, one or more wicks joined to the bottom substrate, and a phase change liquid contained in the vapor chamber. The one or more wicks and the phase change liquid are contained between the condenser surface and bottom substrate.

In one embodiment, the bottom substrate is a device substrate comprising a device surface and a rear surface, and the one or more wicks are joined to one of the surfaces of the device substrate. In one embodiment, the bottom substrate may be an evaporator substrate bonded to a device substrate, and the condenser surface may be bonded to the evaporator substrate. The one or more wicks may be joined to the evaporator substrate.

Regardless of the type of bottom substrate used, in at least some embodiments the vapor chamber functions by absorbing heat generated by the device with the phase change liquid, which is in contact with the bottom substrate. The heat causes the phase change liquid to vaporize and absorb thermal energy through the phase change. When the vapor hits the condenser substrate, the vapor cools and reverts back to liquid, which is drawn down toward the bottom substrate through gravity or capillary pressure from the one or more wicks. Through the vaporization and condensation process, the heat is spread uniformly throughout the vapor chamber.

Figure 1:
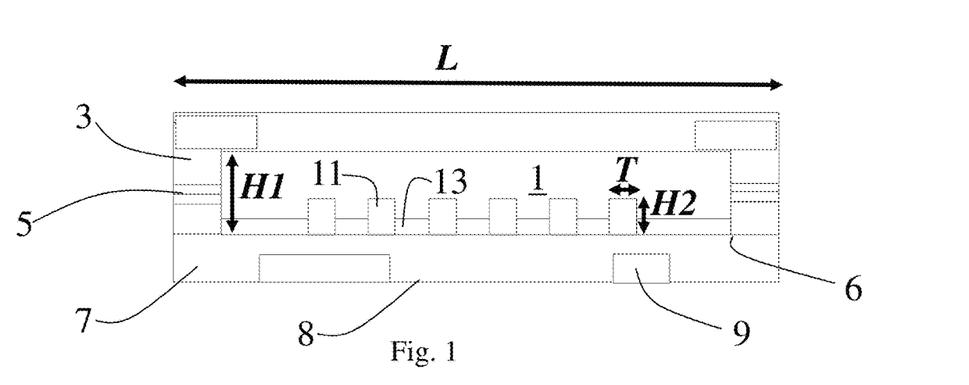
FIG. 1 is a schematic cross-section of a monolithic phase change heat dissipating device according to a first embodiment.

Turning now to the figures, FIG. 1 shows a cross-section of a first embodiment of a monolithic MEMS heat dissipating device that is integrated into a circuit. In one embodiment, the heat dissipating device is a vapor chamber 1 that comprises a condenser substrate 3 bonded with a bonding material 5, such as metal or a thermal adhesive, to a rear surface 6 of a device substrate 7, which has one or more devices 9 embedded therein. Within the vapor chamber 1, one or more wicks 11 are joined to the device substrate 7 and extend into the vapor chamber 1, which is filled with a phase change liquid 13.

Figure 2:
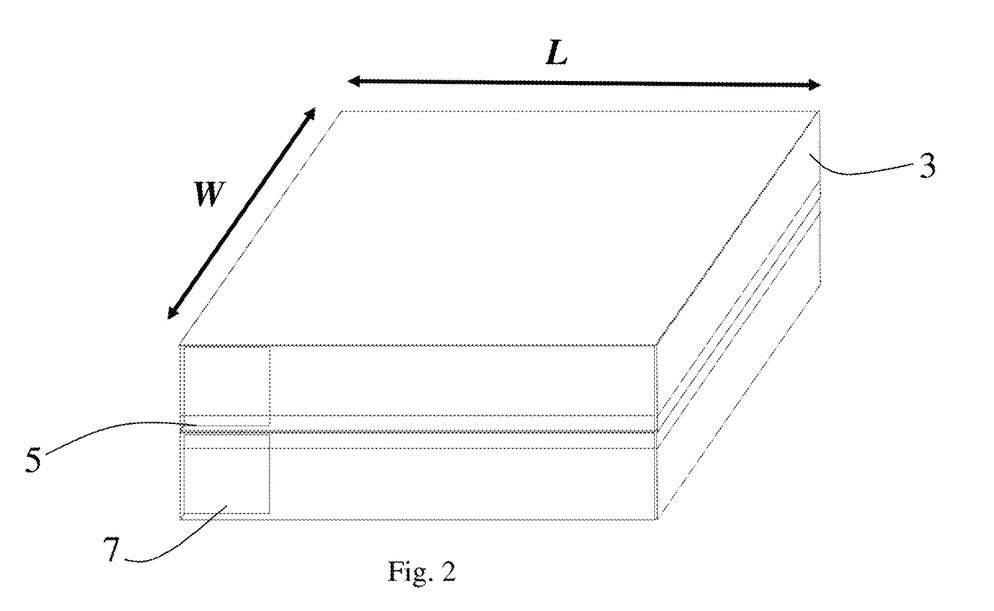
FIG. 2 is a schematic drawing of an exterior of the monolithic phase change heat dissipating device shown in FIG. 1.

The monolithic vapor chamber 1 may have the same footprint as the device substrate 7 in this embodiment, meaning that they share a length L and a width W, as shown in the exterior perspective view of FIG. 2. As a result, the monolithic vapor chamber 1 may occupy approximately or substantially the same area as the device substrate 7. In some embodiments, such as that illustrated, the monolithic vapor chamber 1 occupies an area less than or equal to the area of the device substrate 7. The height H1 of the monolithic vapor chamber 1 (perpendicular to both L and W) may assume any suitable value. In one embodiment, the vapor chamber 1 has a height that is substantially greater than a height of the device substrate 7. In one embodiment, width W and length L may be between 1 mm-10 cm, although width W and length L do not have to be equal. In another embodiment, the length L and width W of the vapor chamber 1 are substantially larger than the height. For example, the length L and width W may be between 1-10,000 times larger than the height (including any value in that range). Although the vapor chamber 1 depicted in FIG. 1 is rectangular, other suitable shapes are possible.

The condenser substrate 3 may be formed of any suitable material. In some embodiments, the condenser substrate 3 is formed from a thermally conductive material, such as copper, aluminum, brass, steel, bronze, an alloy of the aforementioned materials, or another suitable material. In at least some embodiments, the condenser substrate 3 is formed of a material compatible with microfabrication techniques (e.g., metal oxide semiconductor (MOS) processing), such that it may be processed in a microfabrication facility. In one embodiment, an interior surface of the condenser substrate 3 that faces the one or more wicks may have a hydrophobic surface. The hydrophobic surface may have a textured coating or be formed of a material that repels the phase change liquid 13. In one embodiment, only portions of the interior surface of the condenser substrate 3 are hydrophobic. In other embodiments, different portions of the interior surface of the condenser substrate 3 may be formed of different hydrophobic materials and/or structures. The condenser substrate 3 may have the same width W and length L as the vapor chamber 1 and device substrate 7.

The device substrate 7 may be formed of any suitable material. In some embodiments, the device substrate 7 comprises silicon, aluminum oxide, aluminum nitride, glass borosilicate, or another suitable material. In other embodiments, the device substrate 7 may be coated with sputtered and/or electroplated materials. For example, the rear surface 6 of the device substrate 7 may be coated with a material that improves thermal conductivity or protects the device substrate 7 from the phase change liquid 13. The device substrate 7 may have approximately or substantially the same width W and length L as the vapor chamber 1 and condenser substrate 3. In one embodiment, the device substrate 7 may be bonded to a wafer. In another embodiment, the device substrate 7 may be bonded to a printed circuit board.

Within the device substrate 7, the one or more devices 9 may be embedded such that the one or more devices 9 are exposed on a device surface 8 of the device substrate 7. In one embodiment, the devices 9 may represent MEMS components, IC components, or other heat generating components. In some embodiments the deices 9 are monolithically formed in the device substrate 7. In some embodiments, the one or more devices 9 are attached to the device substrate 7, for example by flip chip bonding or placing components into wells or trenches and attaching them by adhesive, interference fit, press fit, or another suitable attachment mechanism. The one or more devices 9 may extend from the device surface 8 of the device substrate 7 to the rear surface 6 of the device substrate 7, or may only extend partially across the thickness of the device substrate 7. Additionally, the one or more devices 9 may occupy the full length of the device substrate 7, or be spaced apart. In one embodiment, the one or more devices 9 are evenly spaced, while in others, the one or more devices 9 are unevenly spaced. The one or more devices 9 may comprise microprocessors, memory, amplifiers, oscillators, timers, counters, switches, comparators, receivers, voltage regulators, logic gates, sensors, or any other suitable integrated circuit components, in some non-limiting embodiments.

The device substrate 9 and condenser substrate 3 may be bonded together along a perimeter of the vapor chamber 1. In one embodiment, the bonding method may comprise adhesive bonding, anodic bonding, eutectic bonding, or another suitable bonding method. The bonding material 5 may comprise thermal adhesives, polymers, epoxies, ultraviolet curable compounds, silicon, or other suitable materials. Depending on the bonding method used, the rear surface 6 of the device substrate 7 may be bonded directly to the condenser substrate 3. Alternatively, the bonding material 5 may bond the rear surface 6 of the device substrate 7 to the condenser substrate 3.

It should be appreciated from the configuration of FIG. 1, that in some embodiments, such as that illustrated, the device substrate 7 may itself serve as the evaporator of the vapor chamber, with no intervening substrates. In one embodiment, a vapor chamber cavity is partially etched into a surface of the device substrate.

The one or more wicks 11 of the vapor chamber 1 may be formed of any suitable material and have any suitable dimensions. In some embodiments, the one or more wicks 11 comprise stainless steel, copper, silicon, carbon nanotubes, copper oxide, or any other suitable material. The material may be formed as a mesh, monoporous powder, biporous powder, sintered powder, functionalized powder, microgroove, or pillar. Furthermore, the one or more wicks 11 may be coated, functionalized, nanostructured, textured, oxidized, plated, heterogeneously structured, patterned, and/or sintered. The porosity of the one or more wicks 11 may be between 0.3-0.5 and the maximum heat flux of the one or more wicks 11 may be between 10-2000 W/cm$^2$. Wick thickness T may range from 1-100 μm and height H2 may range from 10 μm-1 mm, although thickness and height may be varied. The length of all of the one or more wicks combined may range from 1-10 mm.

The one or more wicks 11 may be positioned in any suitable manner. In one embodiment, the one or more wicks 11 are spaced evenly across the rear surface 6 of the device substrate 7. In another embodiment, the one or more wicks 11 are randomly placed or unevenly distributed across the rear surface 6 of the device substrate 7. The one or more wicks 11 may be joined to the rear surface 6 of the device substrate 7 by sintering, growth, adhesion, or any other suitable attachment method. In one embodiment, the one or more wicks 11 are fabricated on a sheet, which is attached as a whole to the rear surface 6 of the device substrate 7.

The phase change liquid 13 may be any suitable fluid. In one embodiment, the phase change liquid 13 comprises water, methyl alcohol, ammonia, glycerin, or another suitable fluid. In other embodiments, enhancement agents such as surfactants may be added. The amount of phase change liquid 13 may be such that the one or more wicks 11 are not fully submerged in the phase change liquid 13 when no vaporization has occurred.

In the non-limiting example of FIG. 1, the monolithic vapor chamber 1 dissipates heat generated by the one or more devices 9. At the device surface 8 of the device substrate 7, the one or more devices 9 may generate heat during operation. A non-negligible portion, and in some cases the majority, of the device heat may be conducted through the rear surface 6 of the device substrate 7, which is in contact with the phase change liquid 13. The heat is transferred from the device substrate 7 as the phase change liquid 13 absorbs the heat and vaporizes. The vapor rises toward the condenser substrate 3, where the vapor condenses into liquid, while the condensation process transfers the device heat to the condenser substrate 3. Through gravity and capillary pressure from the one or more wicks 11, the liquid returns to contact the rear surface 6 of the device substrate 7. As the process is passive, the heat dissipating device does not require external input to distribute the heat.

In one embodiment with multiple devices, at least one of the devices 9 may be differently shaped and generate a different amount of heat from the others. For example, a processor may generate a large amount of heat, whereas a bigger memory chip may generate significantly less heat. In one embodiment, the multiple devices may be positioned such that heat from multiple devices is superimposed at portions of the rear surface 6. As a result, the heat flux across the rear surface 6 of the device substrate 7 may differ. Furthermore, although heat may primarily be dissipated through the rear surface 6 of the device substrate 7, a fraction of the heat may dissipate from the device surface 8 of the device substrate 7.

In one embodiment, the condenser substrate 3 may be modified to regulate the temperature. For example, keeping the condenser substrate 3 below a predetermined temperature may accelerate the condensation process and improve heat transfer efficiency, as vapor condenses more quickly on a cooler substrate. As the vapor condenses and transfers heat to the condenser substrate 3, the condenser substrate 3 may dissipate the heat to surrounding air. In one embodiment, the rate of heat dissipation to the air may be greater than the rate of heat transfer due to condensation. As a result, the temperature of the condenser substrate may rise and slow the rate of condensation and heat transfer. In one embodiment, an exterior surface of the condenser substrate 3 may be surrounded by a cooling fluid, such as water or chilled air, to increase the rate of heat dissipation from the condenser substrate 3. In other embodiments, the cooling fluid may circulate around the exterior surface of the condenser substrate 3 to wick the dissipated heat away from the heat dissipating device.

Figure 3:
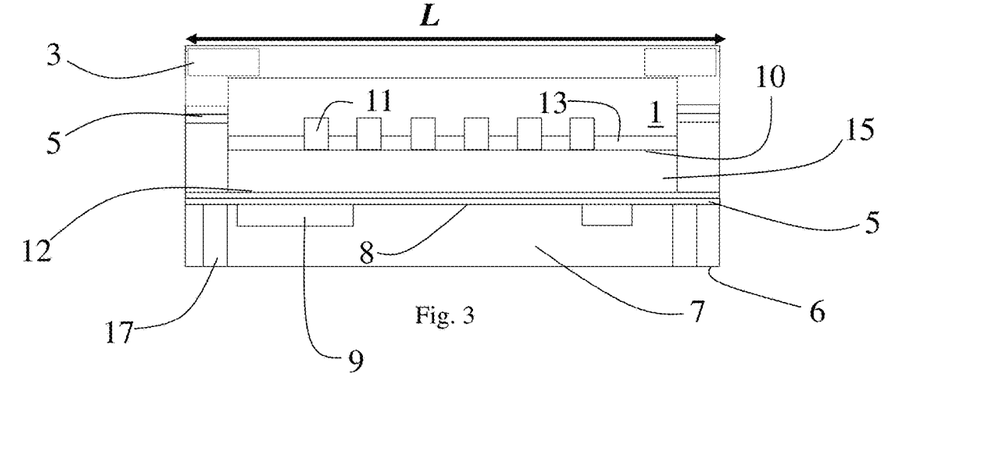
FIG. 3 is a schematic cross-section of a monolithic phase change heat dissipating device with an evaporator surface according to a second embodiment.

FIG. 3 shows a cross-section of a monolithic vapor chamber according to a second embodiment. The vapor chamber 1 comprises a condenser substrate 3 bonded to a first surface 10 of an evaporator substrate 15 with a phase change liquid 13 and one or more wicks 11 contained within the vapor chamber 1 formed by the condenser substrate 3 and evaporator substrate 15. The one or more wicks 11 are joined to the first surface 10 of the evaporator substrate 15. A second surface 12 of the evaporator substrate 15 opposite the first surface 10 may be bonded to the device surface 8 of the device substrate 7, described previously in connection with FIG. 1. Through-silicon vias (TSVs) 17 may be formed from the device surface 8 to the rear surface 6 of the device substrate 7.

The condenser substrate 3 may be bonded to the evaporator substrate 15 along an outer perimeter of the vapor chamber 1. In one embodiment, the bonding method may comprise adhesive bonding, anodic bonding, eutectic bonding, or another suitable bonding method. The bonding material 5 between the condenser substrate 3 and the evaporator substrate 15 may be thermally insulating, although embodiments with distinct thermally conductive portions are possible.

The one or more wicks 11 and the phase change fluid 13 of the current embodiment may be the same as described previously in connection with FIG. 1. Furthermore, the footprint of the vapor chamber 1 may be the same as the footprint of the device substrate 7. In one embodiment, the condenser substrate 3, evaporator substrate 15, and device substrate 7 have substantially the same length L and width (not shown).

In contrast to the embodiment of FIG. 1, the current embodiment has an evaporator substrate 15 intermediate the condenser substrate 3 and the device substrate 7. Because the evaporator substrate 15 acts as an additional thermal interface between the condenser substrate 3 and the device substrate 7, the heat transfer efficiency of the current embodiment may be lower than that of the embodiment of FIG. 1. The evaporator substrate 15 may be formed of any suitable material. In some embodiments, the evaporator substrate 15 comprises copper, aluminum, brass, steel, bronze, an alloy of the aforementioned materials, or another suitable material. In other embodiments, the first and/or second surfaces 10, 12 of the evaporator substrate 15 may be textured or coated with sputtered and/or electroplated materials. For example, the first and/or second surfaces 10, 12 of the evaporator substrate 15 may be coated with a material that improves thermal conductivity or protects the evaporator substrate 15 from the phase change liquid 13.

The second surface 12 of the evaporator substrate 15 may be bonded to the device surface 8 of the device substrate 7. In one embodiment, the bonding method may comprise those described above. Furthermore, the bonding material 5 between the evaporator substrate 15 and the device substrate 7 may thermally couple the evaporator substrate 15 and the device substrate 7, such that heat is efficiently transferred between them.

While the embodiment of FIG. 1 couples the rear surface 6 of the device substrate 7 to the vapor chamber 1, the current embodiment bonds the device surface 8 of the device substrate 7 to the evaporator substrate 15 of the vapor chamber 1. In one embodiment, the one or more devices 9 are flush with the device surface 8 of the device substrate 7 and come into contact with the material used to bond the evaporator substrate 15 to the device substrate 7. As in FIG. 1, the device substrate 7 may comprise any suitable material, including the ones listed above. The one or more devices 9 may be embedded in the device surface 8 of the device substrate 7. Although the device heat is substantially transferred to the evaporator substrate 15, a fraction of the device heat may be dissipated through the rear surface 6 of the device substrate 7.

With the one or more devices 9 facing the vapor chamber 1, electrical access structures may be provided to allow electrical connection to the devices 9. In the illustrated embodiment, TSVs 17 conductively couple the one or more devices 9 of the device surface 8 of a silicon device substrate 7 to the rear surface. The TSVs 17 may comprise vertical electrical connections through the silicon. There may be one TSV 17 or each of the one or more devices 9, or a single TSV 17 that couples several of the one or more devices 9 together. The number of TSVs is not limiting. Each TSV 17 may comprise a 10-20 μm opening in the shape of a square, a circle, or other suitable shape with an aspect ratio between 20-50. The opening is filled with a conductive metal paste, such as copper, silver, an alloy, or another suitable material. In one embodiment, the opening may be lined with a material such as silicon dioxide prior to filling with the conductive metal paste. The one or more devices 9 may be insulated from the remainder of the circuit by the device substrate 7, to conductively connect the one or more devices 9.

Figure 4:
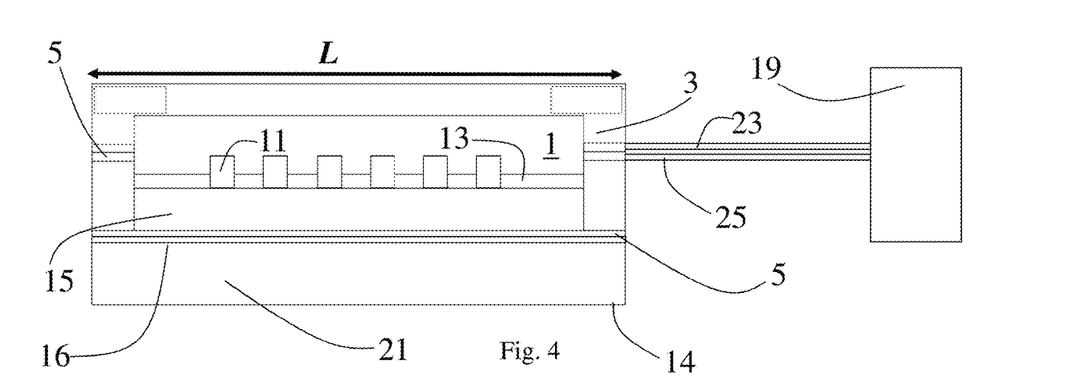
FIG. 4 is a schematic cross-section of a monolithic phase change heat dissipating device with an external condenser according to a third embodiment.

FIG. 4 shows a monolithic vapor chamber heat dissipater with an external condenser, according to a third embodiment. The vapor chamber 1 comprises a condenser substrate 3 bonded to an evaporator substrate 15, which is bonded to a thermoelectric generator 21 with a first surface 14 and a second surface 16. The vapor chamber 1 contains a phase change liquid 13 and one or more wicks 11. External to the vapor chamber 1 is a condenser 19, which is connected to the vapor chamber 1 by a vapor line 23 and a liquid line 25.

Components of the vapor chamber 1, including the condenser substrate 3, the evaporator substrate 15, the phase change liquid 13, and the one or more wicks 11 may be the same as described above in connection with the previous embodiments.

The thermoelectric generator 21 may comprise a circuit with thermoelectric materials. In one embodiment, the thermoelectric materials may comprise alloys of silicon germanium, bismuth or lead, including but not limited to bismuth telluride and lead telluride, lead telluride, or any other suitable material. The thermoelectric generator 21 may comprise individual thermoelectric elements that are contained between the first surface 14 and second surface 16. The length L and width (not shown) of the thermoelectric generator 21 may be approximately or substantially the same as the vapor chamber 1. The thermoelectric generator 21 may be bonded to the evaporator substrate 15 as described in FIG. 1.

The condenser 19 may comprise an air cooled condenser, a water cooled condenser, evaporative condenser, a finned condenser, a shell-and-tube condenser, a double pipe condenser, or another suitable condenser. The condenser material may maximize the heat transfer capability. Consequently, the condenser 19 may be formed of copper, brass, copper nickel, aluminum, stainless steel, or another suitable material. In one embodiment, the condenser 19 is larger than the vapor chamber 1. In another embodiment, the condenser 19 comprises one or more structures, which may include but is not limited to a coil, a wick, a fin, or another suitable structure.

The vapor line 23 and liquid line 25 connect the condenser 19 to the vapor chamber 1. The vapor line 23 and liquid line 25 may comprise microcapillary tubes with diameters between 1-100 μm and lengths between 1-100 cm. In one embodiment, the vapor line 23 and liquid line 25 are formed of copper, glass, or another suitable material.

When heat is applied to the thermoelectric generator 21 at the first surface 14, the thermoelectric generator 21 may convert the heat into electricity that is directed out through conductive leads (not shown). Any residual heat may be dissipated out of the second surface 16 of the thermoelectric generator 21 and into the evaporator substrate 15. As the evaporator substrate 15 receives the heat, the heat may be absorbed by the phase change medium, which vaporizes and further absorbs heat through the vaporization process. A portion of the vapor rises to the condenser substrate 3, where the vapor transfers the heat to the condenser substrate 3 as it condenses back to liquid. The liquid is drawn toward the evaporator substrate 15 by gravity or the one or more wicks 11.

The remaining vapor passes through the vapor line 23 and into the condenser 19. In some embodiments, the rate of the vapor passing through the vapor line 23 is limited by the vapor line diameter 23. The vapor may condense on an interior surface of the condenser 19 and subsequently transfer the heat to the condenser 19. In one embodiment, the one or more structures within the condenser 19 increase condensation and the heat transfer rate. In another embodiment, the condenser 19 has a rate of thermal transfer that is greater than the condenser 19.

After the vapor has condensed and reverts to liquid form, the liquid line 25 carries the liquid back to the vapor chamber 1. In one embodiment, the diameter of the liquid line 25 limits the rate of returning liquid back to the vapor chamber 1. In other embodiments, the liquid that returns to the vapor chamber 1 through the liquid line is cooler than the liquid that vaporized and condensed in the vapor chamber 1.

Figure 5A:
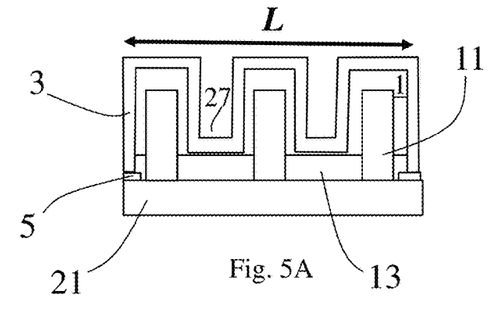
FIGS. 5A and 5B are a schematic cross-section and top view, respectively, of a monolithic phase change heat dissipating device with a contoured condenser substrate according to a fourth embodiment.
Figure 5B:
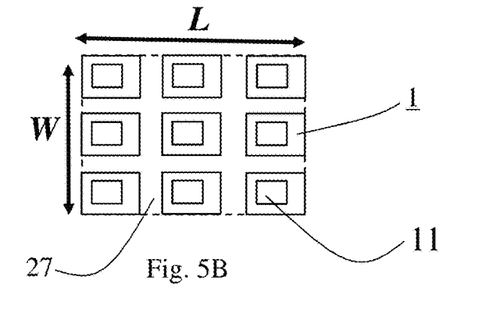

FIGS. 5A and 5B show a monolithic vapor chamber heat dissipater according to a fourth embodiment. The vapor chamber comprises a thermoelectric generator 21, a contoured condenser substrate 3 that forms individual vapor chambers 1, each containing one or more wicks 11, and a phase change liquid 13.

As with the condenser substrate described in connection with FIGS. 1 and 4, the contoured condenser substrate 3 of FIGS. 5A and 5B may comprise any suitable material and may be bonded to the thermoelectric generator 21 using any suitable method that preserves thermal conductivity. In one embodiment, the contoured condenser substrate 3 has evenly spaced indentations 27 that define a plurality of chambers 1, with one chamber 1 between two adjacent indentations 27. The indentations 27 may extend to the phase change liquid 13, such that the indentations 27 of the condenser substrate 3 are in contact with the phase change liquid 13 and no vapor is formed between each chamber 1. In one embodiment, each chamber 1 is wider than the one or more wicks 11 contained within each chamber 1.

The contoured condenser substrate 3 may have any suitable shape. In the illustrated embodiments, the contours form rectangular pillars. However, other shapes are possible. For example, cylindrical contours may be used. Also, the vapor chambers 1 in FIGS. 5A and 5B may have sloped sidewalls in some embodiments. Thus, variations on the illustrated contour shape are possible.

The wicks and phase change material may have the characteristics described in connection with FIG. 1. Alternatively, multiple wicks 11 that are uniform or different in shape and/or size may be contained within each chamber 1. In another embodiment, the chambers 1 may be uniformly sized and spaced across the contoured condenser substrate 3, or may have differing sizes and spacing. The full length of the chambers 1 and indentations 27 that comprise the contoured condenser substrate 3 may share a length L and a width W with the thermoelectric generator 21.

The thermoelectric generator 21 may comprise any suitable form and material, as described in FIG. 4. In the embodiment shown, the thermoelectric generator 21 is directly bonded to the condenser substrate 3 along a perimeter, and the phase change liquid 13 and one or more wicks 11 are in contact with a surface of the thermoelectric generator 21. Similar to the embodiment of FIG. 1, the lack of an evaporator substrate reduces the number of thermal interfaces between the thermoelectric generator 21 and the vapor chambers 1 and consequently increases the thermal transfer efficiency.

Figure 6:
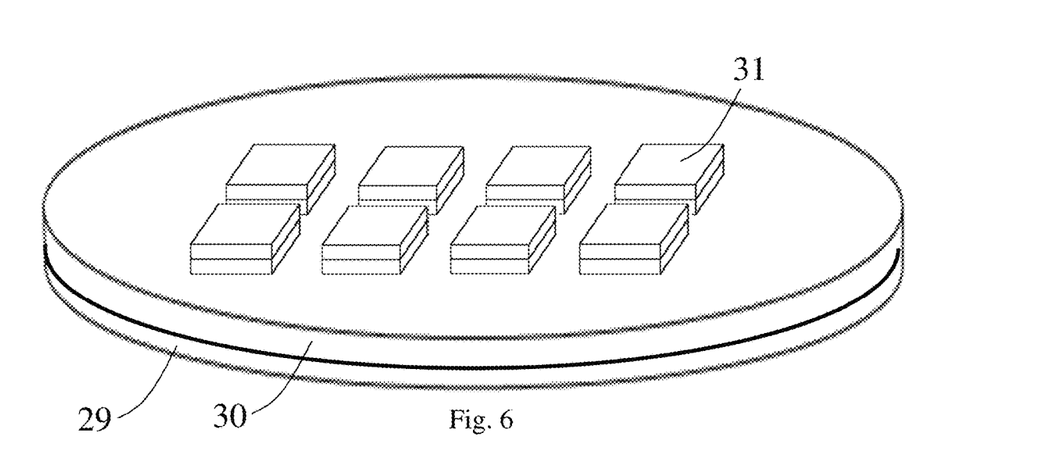
FIG. 6 is a schematic drawing of a plurality of monolithic phase change heat dissipating devices formed on a wafer.

Monolithic heat dissipating devices may be formed at the wafer level according to embodiments of the present application. Such wafer level processing may allow formation of multiple heat dissipating devices at the same time, which may then be diced to form individual devices. FIG. 6 shows a wafer-level structure including multiple monolithic vapor chamber dissipating devices 31. The illustrated structure may include a device wafer 29 and condenser wafer 30. The device wafer 29 may include devices of the types previously described herein, such as a collection of device substrates 7. Condenser wafer 30 may be patterned to form condenser substrates of the types described previously herein. Thus, multiple monolithic vapor chamber dissipating devices 31 representing any of the monolithic vapor chamber heat dissipating devices described herein may be formed. In one embodiment, the vapor chambers may all be fabricated at the same time, using techniques that include but are not limited to physical deposition, chemical deposition, wet etching, dry etching, micromachining, bonding, photolithography, and sputtering. Although the vapor chambers may be identical, it is possible to fabricate vapor chambers with different features as described above. Any of the embodiments or combination of the embodiments described above may be fabricated on the wafer. For example, a monolithic heat dissipater with a contoured condenser surface may be fabricated alongside a heat dissipating device that uses an evaporator surface.

Figure 7:
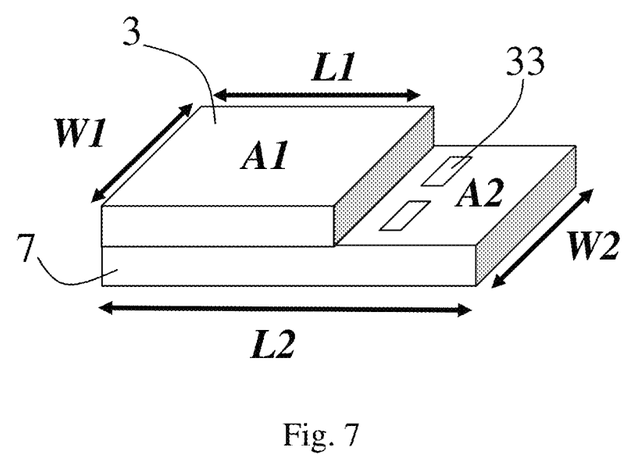
FIG. 7 is a schematic drawing of a monolithic phase change heat dissipating device according to a fifth embodiment.

According to some aspects of the present application, a device substrate and heat dissipating device may have different footprints, for a variety of reasons. For example, making electrical contact to the device substrate may be facilitated by having a portion of the device substrate that is not overlapped by the heat dissipating device. FIG. 7 shows an embodiment of a heat dissipating device and a device substrate with different footprints. The heat dissipating device may comprise a condenser substrate 3, which is mounted to a device substrate 7 with one or more pads 33 exposed on a surface to facilitate connection to an external structure, for example by wire bonds or otherwise.

As in previous embodiments, the device substrate 7 and condenser substrate 3 are formed of any suitable material, are bonded in any suitable way, and have any suitable dimensions. In the embodiment shown, the device substrate 7 has a larger footprint than the condenser substrate 3, such that the area A1 of the condenser substrate is smaller than the area A2 of the device substrate 7. In some embodiments, the area A1 of the condenser substrate 3 is in a range of +/−20% the area A2 of the device substrate 7 (including any value within that range). One or both of the length L1 and width W1 of the device substrate 7 may be different from the length L2 and width W2 of the condenser substrate 3, causing one or multiple sides of the device substrate 7 to extend past edges of the condenser substrate 3 or vice versa.

Between the device substrate 7 and condenser substrate 3, there may be an intermediate substrate with suitable dimensions. The intermediate substrate may have a footprint that is the same as the footprint of either the device substrate 7 or condenser substrate 3, or in between the sizes of those two.

Multiple dicing steps may be used to fabricate a monolithic device that has a device substrate 7 having a different footprint from the condenser substrate 3. In one embodiment, one of the device substrate 7 and condenser substrate 3 is diced to a first area, then the other of the device substrate 7 and condenser substrate is diced to a second area. Alternative dicing processes are possible.

In embodiments with a device substrate 7 that is larger than the condenser substrate 3, one or more pads 33 may be exposed on the surface of the device substrate 7. The one or more pads 33 may provide electrical connections to one or more devices within the device substrate 7. In one embodiment, the one or more pads 33 may cover and be electrically coupled to TSVs that extend within the device substrate 7. The one or more pads 33 may be soldered or brazed to wire to connect the one or more devices to an external circuit, although other suitable connection methods are possible.

The overhang of one substrate relative to another may also allow for fluid connections to be made. For example, the vapor line 23 and liquid line 25 may be connected to an exposed surface of a substrate, and thus the connection may be facilitated by having a portion of the substrate which is not covered by an opposing substrate. Thus, for example, the embodiments of FIG. 4 may be modified have one of the substrates present an exposed region for connection of the vapor line and/or liquid line.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A monolithic microelectromechanical (MEMS) device including a vapor chamber, the device comprising:
   a condenser substrate;
   a device substrate having a device surface comprising an integrated circuit disposed therein and a rear surface, wherein the vapor chamber is enclosed between the condenser substrate and one of the device surface or rear surface of the device substrate, wherein the condenser substrate has approximately a same footprint as the device substrate;

a phase change liquid disposed in the vapor chamber, the phase change liquid being in contact with the device substrate; and one or more wicks extending into the vapor chamber.

2. The monolithic MEMS device of claim 1, wherein the condenser substrate is bonded to the rear surface of the device substrate.

3. The monolithic MEMS device of claim 2, wherein the vapor chamber is enclosed between the rear surface of the device substrate and the condenser substrate.

4. The monolithic MEMS device of claim 1, wherein the condenser substrate is contoured and is bonded to the device substrate such that it defines a plurality of chambers.

5. The monolithic MEMS device of claim 4, wherein first and second chambers of the plurality of chambers each include at least one of the one or more wicks.

6. The monolithic MEMS device of claim 1, wherein the one or more wicks is joined to the device substrate.

7. A micro-scale heat dissipation device, comprising:

a device substrate having a device surface comprising an integrated circuit disposed therein, the device substrate having a first width and a first length;

a condenser substrate having a second width approximately equal the first width and a second length approximately equal the first length, wherein the device substrate and condenser substrate are coupled together to define a vapor chamber between them, wherein the device substrate is configured such that, when a phase change liquid is disposed in the vapor chamber, the device substrate is exposed to the phase change liquid; and a wick disposed at least partially in the vapor chamber.

8. The micro-scale heat dissipation device of claim 7, wherein the device substrate has a rear surface opposite the device surface, and wherein the device surface is between the rear surface and the condenser substrate.

9. The micro-scale heat dissipation device of claim 8, wherein the device substrate comprises a through silicon via (TSV) providing electrical connection to the integrated circuit.

10. The micro-scale heat dissipation device of claim 7, wherein the device substrate has a rear surface opposite the device surface, and wherein the rear surface is between the device surface and the condenser substrate.

11. The micro-scale heat dissipation device of claim 7, wherein the vapor chamber comprises a plurality of indentations, and wherein the wick is disposed in the vapor chamber between adjacent indentations of the plurality of indentations.

12. A micro-scale heat dissipation device, comprising:

a device substrate having a device surface comprising an integrated circuit disposed therein and a rear surface;

a cap coupled to the device substrate through a support structure, the cap and the device substrate having a vapor chamber formed between them, the vapor chamber being bounded by the device substrate, the cap and, in a plane parallel to the device surface, by the support structure, wherein, when a phase change liquid is disposed in the vapor chamber, the device substrate is configured to contact the phase change liquid; and a wick disposed at least partially in the vapor chamber.

13. The micro-scale heat dissipation device of claim 12, further comprising an external condenser and a vapor outlet line coupled between the vapor chamber and the external condenser.

14. The monolithic MEMS device of claim 1, wherein the device substrate comprises a through silicon via (TSV) providing electrical connection to the integrated circuit.

15. The monolithic MEMS device of claim 1, further comprising an external condenser and a vapor outlet line coupled between the vapor chamber and the external condenser.

16. The micro-scale heat dissipation device of claim 7, wherein the condenser substrate is contoured and is bonded to the device substrate such that it defines a plurality of chambers.

17. The micro-scale heat dissipation device of claim 16, wherein first and second chambers of the plurality of chambers each include at least one of the one or more wicks.

18. The micro-scale heat dissipation device of claim 12, wherein the support structure is disposed on the device surface.

19. The micro-scale heat dissipation device of claim 12, wherein the cap has a hydrophobic surface.

20. The micro-scale heat dissipation device of claim 12, wherein the cap is formed from a thermally conductive material.

* * * * *